(12) United States Patent
Choi et al.

(10) Patent No.: US 10,418,430 B2
(45) Date of Patent: Sep. 17, 2019

(54) DISPLAY DEVICE (71) Applicant: LG DISPLAY CO., LTD., Seoul (KR)

(72) Inventors: Kwangyong Choi, Paju-si (KR);
Kihyung Lee, Paju-si (KR); Sungman Han, Paju-si (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 16/216,282

(22) Filed: Dec. 11, 2018

(65) Prior Publication Data
US 2019/0189717 A1 Jun. 20, 2019

(30) Foreign Application Priority Data
Dec. 20, 2017 (KR) .......................... 10-2017-0175983

(51) Int. Cl.
*H01L 27/32* (2006.01)
*H01L 51/52* (2006.01)
(Continued)

(52) U.S. Cl.
CPC ........ *H01L 27/3258* (2013.01); *H01L 27/322* (2013.01); *H01L 27/3246* (2013.01); *H01L 27/3272* (2013.01); *H01L 51/5212* (2013.01); *H01L 51/5253* (2013.01); *H01L 51/5284* (2013.01); *H01L 51/56* (2013.01); *G09G 3/3266* (2013.01); *G09G 3/3275* (2013.01);
(Continued)

(58) Field of Classification Search
CPC ............. H01L 27/3246; H01L 27/3258; H01L 51/5212

USPC ...................................................... 257/40, 59
See application file for complete search history.

(56) References Cited

U.S. PATENT DOCUMENTS 8,004,180 B2 * 8/2011 Seo ...................... H01L 27/3246
313/498
9,590,212 B2 * 3/2017 Matsumoto ............. H01L 51/56
(Continued)

FOREIGN PATENT DOCUMENTS

| EP | 3240036 A1 | 11/2017 |
| KR | 10-2016-0127459 A | 11/2016 |
| KR | 10-2017-0026013 A | 3/2017 |

*Primary Examiner* — Lex H Malsawma
*Assistant Examiner* — Eric W Jones
(74) *Attorney, Agent, or Firm* — Birch, Stewart, Kolasch & Birch, LLP (57) ABSTRACT

A display device including a substrate including an emitting region and a non-emitting region; an auxiliary electrode disposed in the non-emitting region; a first passivation film covering the emitting region and the auxiliary electrode in the non-emitting region and including a first passivation hole exposing the auxiliary electrode; an overcoat layer disposed on the first passivation film and includes an over-hole exposing the auxiliary electrode; a first barrier layer disposed on the first passivation film and the overcoat layer and contacting the auxiliary electrode; a second passivation film disposed on the first barrier layer and including a second passivation hole exposing the first barrier layer; a bank layer disposed on the second passivation film and including a bank hole exposing the first barrier layer and having an undercut structure; an organic layer disposed on the bank layer and disconnected by the undercut structure; and a second electrode disposed on the organic layer and contacting the first barrier layer via the bank hole of the bank layer.

20 Claims, 8 Drawing Sheets

(51) Int. Cl.
*H01L 51/56* (2006.01)
*G09G 3/3275* (2016.01)
*G09G 3/3266* (2016.01)

(52) U.S. Cl.
CPC .............. *G09G 2300/0819* (2013.01); *G09G 2310/0289* (2013.01); *G09G 2310/08* (2013.01); *H01L 2227/323* (2013.01); *H01L 2251/558* (2013.01)

(56) References Cited

U.S. PATENT DOCUMENTS

| | | | |
|---|---|---|---|
| 9,947,887 B2* | 4/2018 | Ichikawa | H01L 51/5228 |
| 2006/0082284 A1* | 4/2006 | Shibusawa | H01L 27/12 313/500 |
| 2010/0127264 A1* | 5/2010 | Bang | H01L 51/5234 257/59 |
| 2013/0109117 A1* | 5/2013 | Lee | H01L 51/5056 438/34 |
| 2015/0144922 A1 | 5/2015 | Moon et al. | |
| 2016/0013438 A1* | 1/2016 | Im | H01L 51/5228 257/40 |
| 2016/0043341 A1* | 2/2016 | Heo | H01L 27/3246 257/40 |
| 2016/0111688 A1* | 4/2016 | Lee | H01L 51/56 257/40 |
| 2016/0149155 A1* | 5/2016 | Kim | H01L 51/5228 |
| 2017/0179209 A1* | 6/2017 | Kim | H01L 27/3246 |

* cited by examiner

DISPLAY DEVICE

This application claims the benefit of Korean Patent Application No. 10-2017-0175983, filed on Dec. 20, 2017, which is incorporated herein by reference for all purposes as if fully set forth herein

BACKGROUND OF THE INVENTION

Field of the Invention

The present invention relates to a display device, and more particularly, to a display device that improves reliability by preventing moisture penetration.

Related Art

With the development of the information society, various demands for display devices for displaying images are on the rise. In the field of display devices, flat panel display devices (FPDs), which are thin and light and can cover a large area, have been rapidly replacing cathode ray tubes (CRTs), which are bulky. The flat panel display devices include liquid crystal displays (LCDs), plasma display panels (PDPs), organic light-emitting displays (OLEDs), electrophoretic displays (EDs), etc.

Among these types of displays, the organic light-emitting displays are self-luminous devices, and have fast response time, high light emission efficiency, great brightness, and wide viewing angles. Notably, the organic light-emitting displays can be fabricated on a flexible plastic substrate, and have advantages over plasma display panels or inorganic light emitting displays in that they can operate at a low voltage, have lower power consumption, and deliver vivid color reproduction, as compared to plasma display panels or inorganic electroluminescence (EL) displays.

Organic light-emitting displays are divided into bottom-emission displays and top-emission displays depending on the direction in which light is emitted. In the bottom-emission displays, light emitted from an emissive layer is emitted toward the bottom, and in the top-emission displays, the light is emitted toward the top. In the top-emission displays, second electrodes formed on the emissive layer to emit light upward from the emissive layer are made thin enough to pass light through. The thinner the second electrodes, the higher the resistance. Hence, there is an ongoing research on preventing an increase in the resistance of the second electrodes.

SUMMARY OF THE INVENTION

The present invention provides a display device that improves reliability and reduce screen defects by preventing an increase in the resistance of second electrodes and preventing moisture penetration.

According to an embodiment, the present invention provides a display device including a substrate comprising an emitting region and a non-emitting region; an auxiliary electrode located in the non-emitting region; a first passivation film that covers the emitting region and the auxiliary electrode in the non-emitting region and comprises a first passivation hole exposing the auxiliary electrode; an overcoat layer that is disposed on the first passivation film and comprises an over-hole exposing the auxiliary electrode; a first barrier layer that is disposed on the first passivation film and the overcoat layer and makes contact with the auxiliary electrode; a second passivation film that is disposed on the first barrier layer and comprises a second passivation hole exposing the first barrier layer; a bank layer with a bank hole that is disposed on the second passivation film and comprises a bank hole exposing the first barrier layer and having an undercut structure; an organic layer that is disposed on the bank layer and is disconnected by the undercut structure; and a second electrode that is disposed on the organic layer and makes contact with the first barrier layer via the bank hole of the bank layer.

Further, the first barrier layer covers the first passivation hole and the over-hole and covers the interface of the first passivation film and overcoat layer which is formed on the inner peripheries of the first passivation hole and over-hole. Part of the inner periphery of the bank hole protrudes than the inner periphery of the second passivation hole.

In addition, the second electrode is disconnected by the undercut structure of the bank hole, the first barrier layer is made of a metal oxide, and the second passivation hole overlaps the auxiliary electrode and the first barrier layer. The emitting region includes an organic light-emitting diode comprising a first electrode, the organic layer, and the second electrode.

Also display device further includes a third passivation film that is disposed on the second electrode; and a second barrier layer that is disposed on the third passivation film. In addition, the first barrier layer and the second barrier layer are made of the same material.

Further scope of applicability of the present invention will become apparent from the detailed description given hereinafter. However, the detailed description and specific examples, while indicating preferred embodiments of the invention, are given by illustration only, since various changes and modifications within the spirit and scope of the invention will become apparent to those skilled in the art from this detailed description.

BRIEF DESCRIPTION OF THE DRAWINGS

The accompany drawings, which are included to provide a further understanding of the invention and are incorporated on and constitute a part of this specification, illustrate embodiments of the invention and together with the description serve to explain the principles of the invention. In the drawings.

DESCRIPTION OF EXEMPLARY EMBODIMENTS

Hereinafter, exemplary embodiments of the present invention will be described in detail with reference to the attached drawings. Throughout the specification, like reference numerals denote substantially like components. The terms and names of elements used herein are chosen for ease of description and may be different from the names of parts used in actual products. When the position relation between two parts is described using the terms "on,"," "over," "under," "next to" and the like, one or more parts may be positioned between the two parts as long as the term "immediately" or "directly" is not used.

A display device according to an embodiment of the present invention includes display elements formed on a glass substrate or flexible substrate. Although examples of the display device include an organic light-emitting display, a liquid-crystal display, and an electrophoretic display, etc., the present invention will be described with respect to an organic light-emitting display. In more detail, the organic light-emitting display includes an organic layer composed of organic materials situated between a first electrode as an anode and a second electrode as a cathode. A hole from the first electrode and an electron from the second electrode recombine within the organic layer, forming an exciton, i.e., a hole-electron pair. Then, energy is created as the exciton returns to the ground state, thereby causing the self-luminous display to emit light.

The display device according to an embodiment of the present invention is a top-emission organic light-emitting display. In the top-emission organic light-emitting display, light emitted from an emissive layer is released through the overlying, transparent second electrode.

Figure 2:
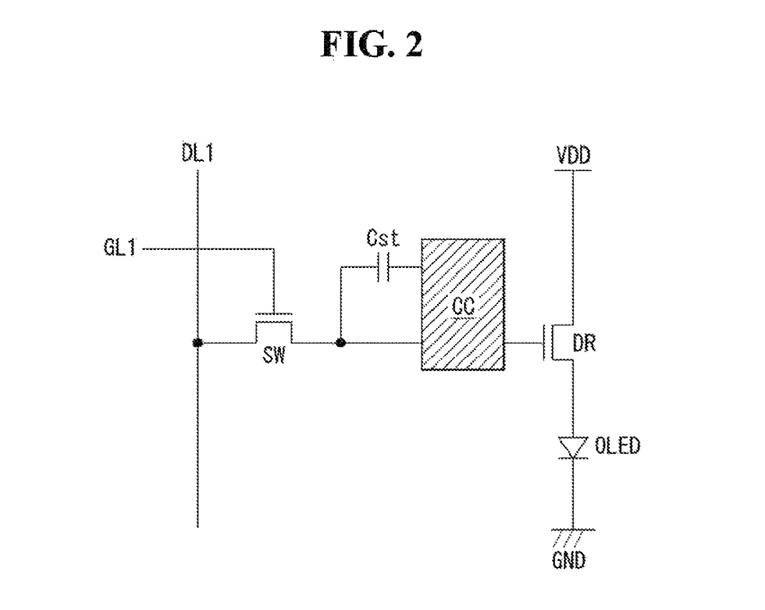
FIG. 2 is a first illustration showing the circuit configuration of a subpixel.
Figure 3:
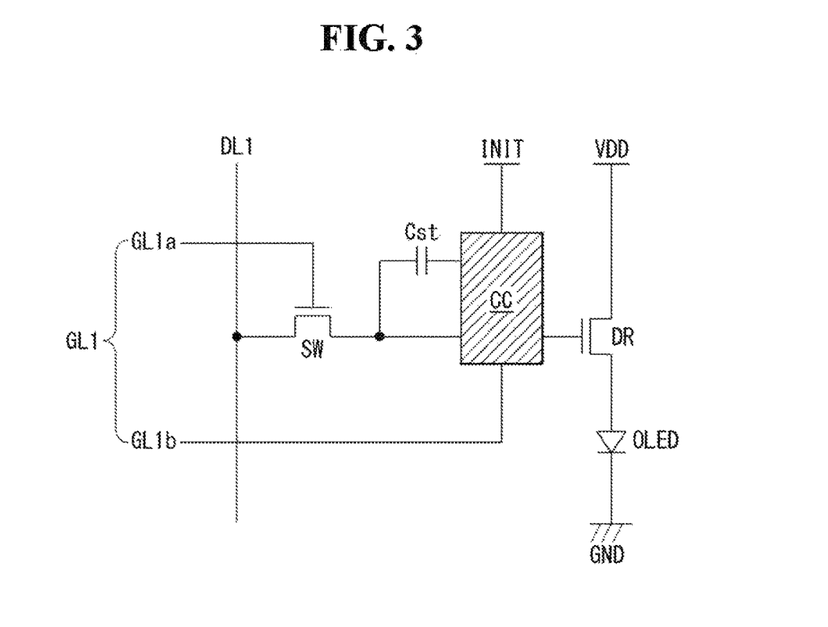
FIG. 3 is a second illustration showing the circuit configuration of a subpixel.

Hereinafter, embodiments of the present invention will be described with reference to the accompanying drawings. In particular, FIG. 1 is a schematic block diagram of an organic light-emitting display, FIG. 2 is a first illustration showing the circuit configuration of a subpixel, and FIG. 3 is a second illustration showing the circuit configuration of a subpixel.

Figure 1:
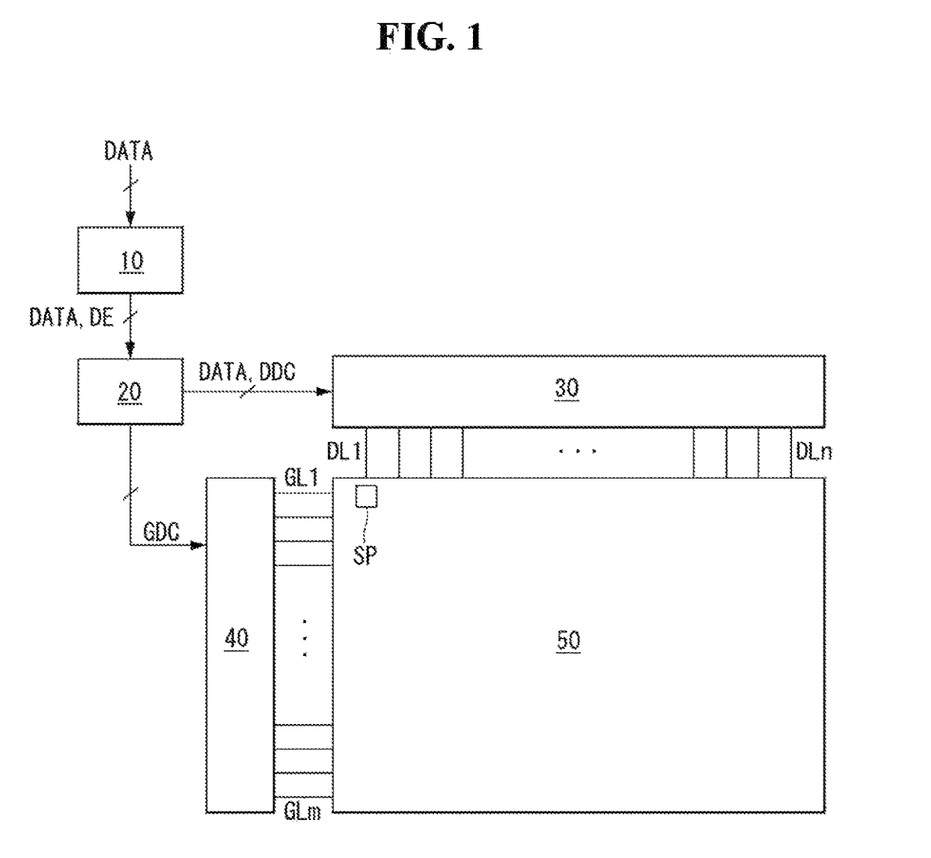
FIG. 1 is a schematic block diagram of an organic light-emitting display.

Referring to FIG. 1, an organic light-emitting display includes an image processor 10, a timing controller 20, a data driver 30, a gate driver 40, and a display panel 50. The image processor 10 outputs a data enable signal DE, etc., along with an externally supplied data signal DATA. Further, the image processor 10 can output one or more among a vertical synchronization signal, horizontal synchronization signal, and clock signal, in addition to the data enable signal DE, but these signals are not shown in the drawings for convenience of explanation. The image processor 10 may also be provided in the form of an IC (integrated circuit) on a system circuit board.

Further, the timing controller 20 receives the data signal DATA from the image processor 10, along with the data enable signal DE or driving signals including the vertical synchronization signal, horizontal synchronization signal, and clock signal. Based on the driving signals, the timing controller 20 outputs a gate timing control signal GDC for controlling the operation timing of the gate driver 40 and a timing control signal DDC for controlling the operation timing of the data driver 30. The timing controller 20 may also be provided in the form of an IC on a control circuit board.

In response to the data timing control signal DDC supplied from the timing controller 20, the data driver 30 samples and latches the data signal DATA supplied form the timing controller 20, converts it to a gamma reference voltage, and outputs the gamma reference voltage. The data driver 30 then outputs the data signal DATA through data lines DL1 to DLn. The data driver 30 can also be bonded onto a substrate in the form of an IC.

In response to the gate timing control signal GDC supplied from the timing controller 20, the gate driver 40 outputs a gate signal while shifting the level of a gate voltage. In more detail, the gate driver 40 outputs the gate signal through gate lines GL1 to GLm. In addition, the gate driver 40 is formed on a gate circuit substrate in the form of an IC, or is formed on the display panel 50 by a gate-in-panel (GIP) technology. Also, the display panel 50 displays an image, corresponding to the data signal DATA and gate signal respectively supplied from the data driver 30 and gate driver 40. The display panel 50 includes subpixels SP that display an image.

Referring to FIG. 2, each subpixel includes a switching transistor SW, a driving transistor DR, a compensation circuit CC, and an organic light-emitting diode OLED. The organic light-emitting diode OLED operates to emit light in response to a drive current provided by the driving transistor DR.

In response to a gate signal supplied through the gate line GL1, the switching transistor SW is switched on so that a data signal supplied through the first data line DL1 is stored as a data voltage in a capacitor Cst. Further, the driving transistor DR operates so that a driving current flows between a high-level power supply line VDD and a low-level power supply line GND in response to the data voltage stored in the capacitor Cst. In addition, the compensation circuit CC compensates for the threshold voltage, etc. of the driving transistor DR. Moreover, the capacitor Cst connected to the switching transistor SW or driving transistor DR can be positioned within the compensation circuit CC. Further, the compensation circuit CC includes one or more thin film transistors and a capacitor, and has a wide variety of configurations depending on the compensation method.

As shown in FIG. 3, with the addition of the compensation circuit CC, the subpixel may further include a signal line, power supply line, etc. for supplying a particular signal or power, as well as driving a compensation thin-film transistor. The gate line GL1 may include a (1-1)-th gate line GL1a for supplying a gate signal to the switching transistor SW and a (1-2)-th gate line GL1b for driving the compensation thin-film transistor included in the subpixel. Further, the additional power supply line may be defined as a reset power supply line INIT for resetting a particular node of the subpixel. However, this is merely an example, and the present invention is not limited thereto.

Meanwhile, FIGS. 2 and 3 illustrate a subpixel including a compensation circuit CC by way of example. However, if a compensating entity or circuit is located outside the subpixel, such as in the data driver 30, etc., then the compensation circuit CC can be omitted. That is, each subpixel can have a 2T(transistor)1C(capacitor) structure including a switching transistor SW, a driving transistor DR, a capacitor, and an organic light-emitting diode OLED, or have various alternative structures like 3T1C, 4T2C, 5T2C, 6T2C, 7T2C, etc., for example, if the compensation circuit CC is added to the subpixel. Although FIGS. 2 and 3 illustrate that the compensation circuit CC is positioned between the switching transistor SW and the driving transistor DR, the compensation circuit CC can be positioned between the driving transistor DR and the organic light-emitting diode OLED. The position and structure of the compensation circuit CC is not limited to those shown in FIGS. 2 and 3.

Figure 4:
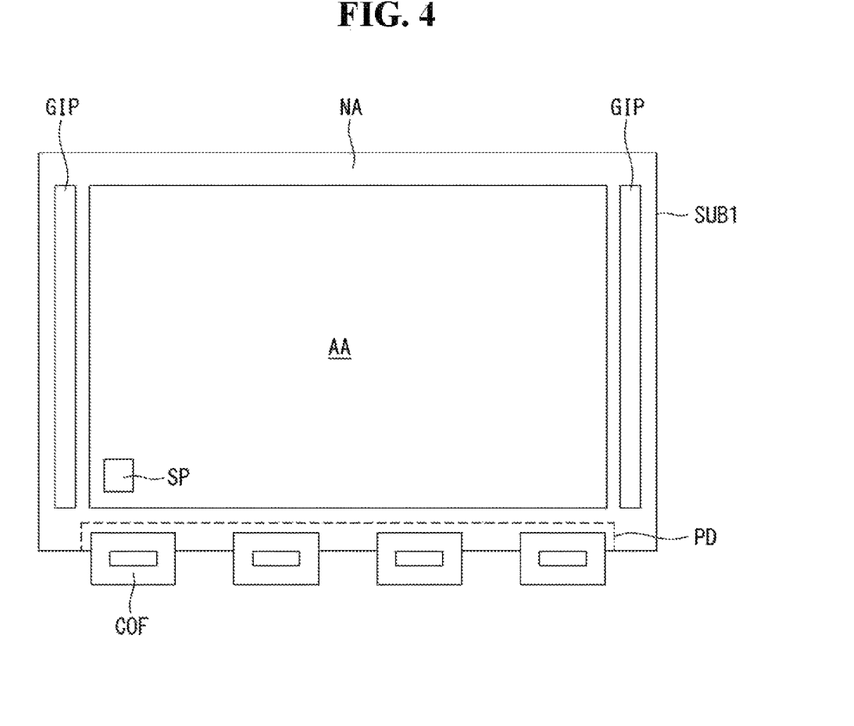
FIG. 4 is a top plan view showing an organic light-emitting display according to an embodiment of the present invention.
Figure 5:
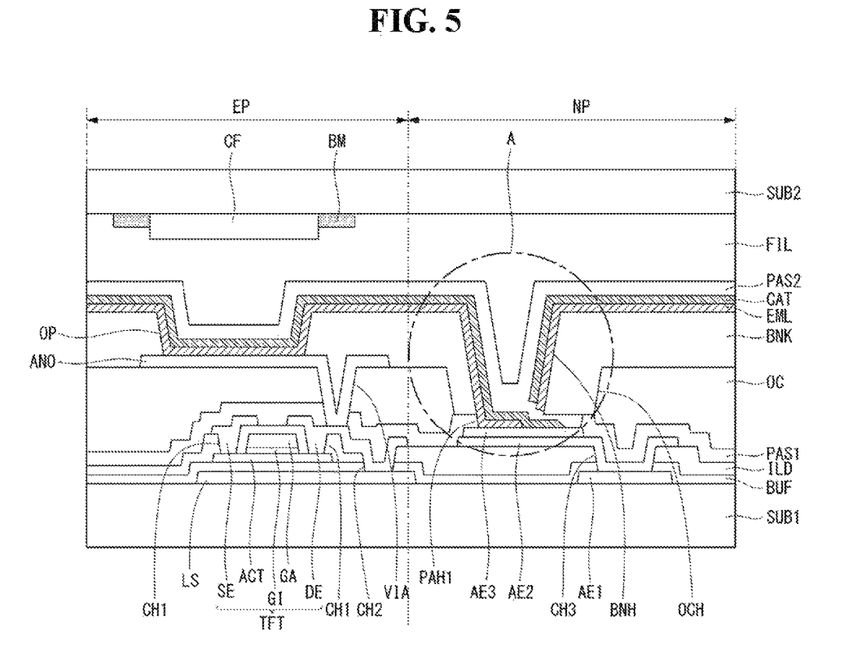
FIG. 5 is a cross-sectional view of a subpixel of the organic light-emitting display according to an embodiment of the present invention.
Figure 6:
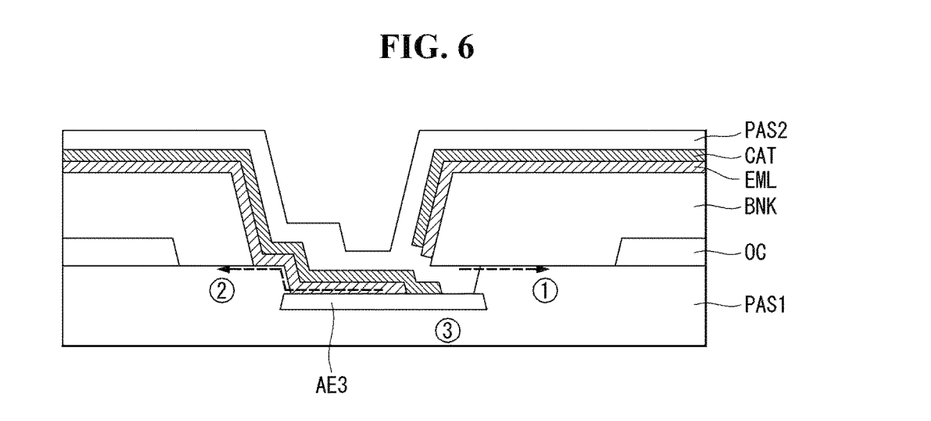
FIG. 6 is an enlarged view of the portion A of FIG. 5.

Next, FIG. 4 is a top plan view showing an organic light-emitting display according to an embodiment of the present invention. Further, FIG. 5 is a cross-sectional view of a subpixel of the organic light-emitting display according to an embodiment of the present invention, and FIG. 6 is an enlarged view of the portion A of FIG. 5.

Referring to FIG. 4, the organic light-emitting display includes a substrate SUB1, a display area A/A, and GIP drivers GIP placed at either side of the display area A/A, and a pad portion PD placed at the bottom of the substrate SUB1. A plurality of subpixels SP are located in the display area A/A and emit R, G, and B or R, G, B, and W to represent full colors. Further, the GIP drivers GIP are placed at either side of the display area A/A and apply a gate driving signal to the display area A/A. Also, the pad portion PD is placed at one side of the display area A/A, for example, at the bottom side, and chip-on-films COF are bonded to the pad portion DP. Data signals and electric power are applied through the chip-on films COF to a plurality of signal lines connected to the display area A/A.

Now, a cross-sectional structure of each subpixel SP of the organic light-emitting display according to an embodiment of the present invention will be described with reference to FIG. 5. Referring to FIG. 5, the organic light-emitting display has a light shielding layer LS and a first auxiliary electrode AE1 that lie on the substrate SUB1. The substrate SUB1 may be made of glass, plastic, or metal, and the light shielding layer LS shields light coming from the outside and prevents photocurrent from being generated in a thin-film transistor.

In addition, the first auxiliary electrode AE1 serves as an auxiliary electrode that reduces the resistance of a second electrode to be described later. Also, a buffer layer BUF is disposed on the light shielding layer LS and the first auxiliary electrode AE1. The buffer layer BUF serves to protect thin-film transistors formed in a subsequent process from impurities such as alkali metal ions leaking out of the substrate SUB1. The buffer layer BUF may also be a silicon oxide (SiOx), a silicon nitride (SiNx), or multiple layers of these compounds.

In addition, a semiconductor layer ACT is disposed on the buffer layer BUF. The semiconductor layer ACT may be formed of silicon semiconductor or oxide semiconductor. The silicon semiconductor may include amorphous silicon or crystallized polycrystalline silicon. Further, the polycrystalline silicon has a high mobility (for example, more than 100 cm$^2$/Vs), low power consumption, and excellent reliability. Thus, the polycrystalline silicon can be applied to a gate driver for a driving element and/or a multiplexer (MUX) or applied to a driving TFT in a pixel.

Because the oxide semiconductor has a low OFF-current, the oxide semiconductor is suitable for a switching TFT which has a short ON-time and a long OFF-time. Further, because the oxide semiconductor can increase a voltage hold time of the pixel due to the low OFF-current, the oxide semiconductor is suitable for a display device requiring low-speed operation and/or low power consumption. In addition, the semiconductor layer ACT includes a drain region and a source region each including p-type or n-type impurities, and also includes a channel between the drain region and the source region.

Also, a gate insulating film GI is disposed on the semiconductor layer ACT. The gate insulating film GI may be silicon oxide SiOx, silicon nitride SiNx or multiple layers of these compounds. Further, a gate electrode GA is also disposed on the gate insulating film GI, corresponding to a certain area of the semiconductor layer ACT, that is, a channel for injecting an impurity. The gate electrode GA may be made up of any one selected from the group consisting of molybdenum (Mo), aluminum (Al), chrome (Cr), gold (Au), titanium (Ti), nickel (Ni), neodymium (Nd), and copper (Cu) or multiple layers of alloys of these elements. Further, the gate electrode GA may be a multilayer formed of one of molybdenum (Mo), aluminum (Al), chrome (Cr), gold (Au), titanium (Ti), nickel (Ni), neodymium (Nd), copper (Cu), or alloys of these elements. For example, the gate electrode GA may consist of dual layers of molybdenum/aluminum-neodymium or molybdenum/aluminum.

An interlayer insulating film ILD for insulating the gate electrode GA is disposed on the gate electrode GA, and may be a silicon oxide film (SiOx), a silicon nitride film (SiNx), or multiple layers of these compounds. First contact holes CH1 exposing part of the semiconductor layer ACT are also located in some regions of the interlayer insulating film ILD. Also, second contact holes CH2 exposing part of the underlying light shielding layer LS and third contact holes CH3 exposing the first auxiliary electrode AE1 are located in some regions of the interlayer insulating film ILD and buffer layer BUF.

A drain electrode DE and a source electrode SE are disposed on the interlayer insulating film ILD. The drain electrode DE is also connected to the semiconductor layer ACT via the first contact hole CH1 exposing the drain region of the semiconductor layer ACT, and the source electrode SE is connected to the semiconductor layer ACT via the first contact hole CH1 exposing the source region of the semiconductor layer ACT. Further, the source electrode SE and the drain electrode DE may consist of a single layer or multiple layers.

If the source electrode SE and the drain electrode DE includes a single layer, they may be made up of any one selected from the group consisting of molybdenum (Mo), aluminum (Al), chrome (Cr), gold (Au), titanium (Ti), nickel (Ni), neodymium (Nd), and copper (Cu), or an alloy of these elements. Further, if the source electrode SE and the drain electrode DE consist of multiple layers, they may be made up of two layers of molybdenum/aluminum-neodymium or three layers of titanium/aluminum/titanium, molybdenum/aluminum/molybdenum, or molybdenum/aluminum-neodymium/molybdenum. As such, a thin film transistor TFT including the semiconductor layer ACT, the gate electrode GA, the drain electrode DE, and the source electrode SE is formed.

In addition, a second auxiliary electrode AE2 is placed in a region spaced apart from the thin-film transistor TFT, for example, in a region where the first auxiliary electrode AE1 is placed. The second auxiliary electrode AE2 is also connected to the first auxiliary electrode AE1 via the third contact hole CH3. Further, a third auxiliary electrode AE3 is disposed on the second auxiliary electrode AE2 and is electrically connected to the first auxiliary electrode AE1 via contact with the second auxiliary electrode AE2.

A first passivation film PAS1 is also disposed on the substrate SUB1 including the thin film transistor TFT and the third auxiliary electrode AE3. In more detail, the first passivation film PAS1 is an insulating film that protects the underlying elements, and may be a silicon oxide film (SiOx), a silicon nitride film (SiNx), or multiple layers of these compounds. An overcoat layer OC is also disposed on the first passivation film PAS1, may be a planarization film for smoothing out irregularities on the underlying structure, and is made of an organic material such as polyimide, benzocyclobutene-based resin, acrylate, etc. The overcoat layer OC may be formed by a method such as SOG (spin on glass), by which the organic material is coated in liquid form and hardened.

Further, a via hole VIA exposing the drain electrode DE is located in some region of the overcoat layer OC. A first passivation hole PAH1 exposing the third auxiliary electrode AE3 is formed in the first passivation film PAS1, and an over-hole OCH exposing the first passivation hole PAH1 and the third auxiliary electrode AE3 is formed in the overcoat layer OC.

In addition, the organic light-emitting diode OLED is disposed on the overcoat layer OC. More specifically, a first electrode ANO is disposed on the overcoat layer OC where the via hole VIA is formed. The first electrode ANO may act as a pixel electrode, and is connected to the drain electrode DE of the thin-film transistor TFT via the via hole VIA. The first electrode ANO is an anode, and may be made of a transparent conductive material, for example, ITO (indium tin oxide), IZO (indium zinc oxide), or ZnO (zinc oxide). In the present invention, the first electrode ANO can be a reflective electrode since the organic light-emitting display has a top-emission structure. Thus, the first electrode ANO further includes a reflective layer made of aluminum (Al), copper (Cu), silver (Ag), nickel (Ni), palladium (Pd) or an alloy of these elements, preferably, APC (silver/palladium/copper alloy).

A bank layer BNK for defining a pixel is also disposed on the first electrode ANO, and is made of an organic material such as polyimide, benzocyclobutene-based resin, acrylate, etc. The bank layer BNK also has a pixel defining portion exposing the first electrode ANO. An organic layer EML exposing the first electrode ANO is located on the entire surface of the substrate SUB1 and is a layer that emits light by the recombination of electrons and holes.

In addition, a hole injection layer or hole transport layer can be formed between the organic layer EML and the first electrode ANO, and an electron transport layer or electron injection layer can be formed on the organic layer EML. A second electrode CAT is also disposed on the organic layer EML, is located on the entire surface of the display area and is a cathode. The second electrode CAT may be made of a transparent metal oxide such as IZO, ITO, or ITZO, or may be made of magnesium (Mg), calcium (Ca), aluminum (Al), silver (Ag), or an alloy thereof.

Meanwhile, the bank layer BNK has a bank hole BNH exposing the over-hole OCH of the overcoat layer OC. The bank hole BNH exposes the third auxiliary electrode AE3 that is disposed below it. Also, the bank hole BNH of the bank layer BNK forms an undercut structure at one side through an undercut process. That is, part of the inner periphery of the bank hole BNH forms an undercut structure that protrudes upward from the first passivation hole PAH1 of the first passivation film PAS1.

In addition, the undercut structure of the bank hole BNH of the bank layer BNK is for bringing the second electrode CAT into contact with the third auxiliary electrode AE3. Specifically, the organic layer EML is disposed on the bank layer BNK, and part of the organic layer EML is disconnected due to the undercut structure of the bank hole BNH of the bank layer BNK. By depositing the second electrode CAT on the organic layer EML, the second electrode CAT can come into contact with the third auxiliary electrode AE3 through the region where the organic layer EML is disconnected.

Also, a second passivation film PAS2 is disposed on the second electrode CAT to protect the organic light-emitting diode OLED and layers that lie under it. A protection substrate SUB2 where color filters CF and a black matrix BM are formed is bonded to the substrate SUB1 through a filler FIL, thereby forming the organic light-emitting display of the present invention.

Referring to FIG. 6, the aforementioned contact structure between the second electrode CAT and the third auxiliary electrode AE3 may act as a path through which moisture penetrates the inside in the boundary region ① between the first passivation film PAS1 and the overcoat layer OC and in the region ② where the organic layer EML and the second electrode CAT is smaller in thickness. This is due to the undercut structure ③ of the bank layer BNK, and the moisture penetration causes deterioration of the organic layer EML or abnormal operation of the thin-film transistor, thereby leading to bright luminescent spots, dark dots, and defects at the contact portion between the second electrode and the auxiliary electrode.

Disclosed below is a display device capable of preventing moisture penetration in the undercut structure of the bank layer BNK.

Figure 7:
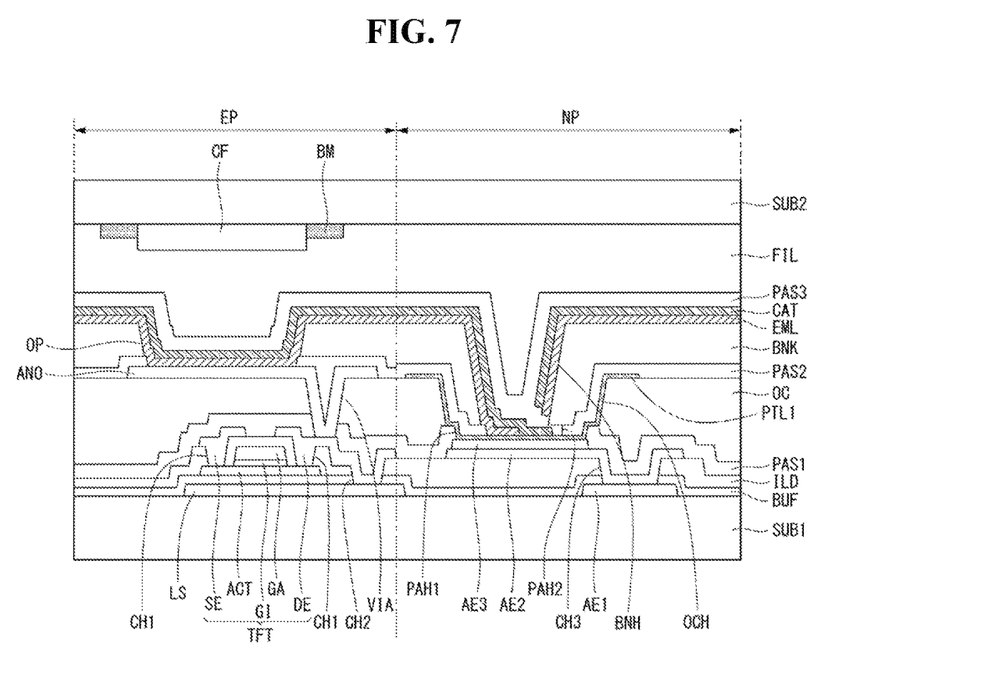
FIG. 7 is a cross-sectional view showing a display device according to an exemplary embodiment of the present invention.

FIG. 7 is a cross-sectional view showing a display device according to an embodiment of the present invention. In addition, FIGS. 8 to 12 are views showing each process of a method for manufacturing a display device according to an embodiment of the present invention. In what follows, the same components as the above-described display device will be denoted by the same reference numerals, and a description of them will be given briefly.

Referring to FIG. 7, the display device according to the embodiment of the present invention includes an emitting region EP and a non-emitting region NP that are on a substrate SUB1. The light shielding layer LS is located in the emitting region EP on the substrate SUB1, and the first auxiliary electrode AE1 is located in the non-emitting region NP. The first auxiliary electrode AE1 acts as an auxiliary electrode that reduces the resistance of the second electrode. A buffer layer BUF is disposed on the light shielding layer LS and the first auxiliary electrode AE1.

In addition, a semiconductor layer ACT is disposed on the buffer layer BUF, and a gate insulating film GI is disposed on the semiconductor layer ACT. A gate electrode GA is disposed on the gate insulating film GI, and an interlayer insulating film ILD for insulating the gate electrode GA is disposed on the gate electrode GA. First contact holes CH1 exposing part of the semiconductor layer ACT are located in some regions of the interlayer insulating film ILD. Also, second contact holes CH2 exposing part of the underlying light shielding layer LS and third contact holes CH3 exposing the first auxiliary electrode AE1 are located in some regions of the interlayer insulating film ILD and buffer layer BUF.

A drain electrode DE and a source electrode SE are disposed on the interlayer insulating film ILD. In addition, the drain electrode DE is connected to the semiconductor layer ACT via the first contact hole CH1 exposing the drain region of the semiconductor layer ACT, and the source electrode SE is connected to the semiconductor layer ACT via the first contact hole CH1 exposing the source region of the semiconductor layer ACT. As such, a thin film transistor TFT including the semiconductor layer ACT, the gate electrode GA, the drain electrode DE, and the source electrode SE is formed.

Also, a second auxiliary electrode AE2 is placed in the non-emitting region NP spaced apart from the thin-film transistor TFT, for example, in a region where the first auxiliary electrode AE1 is placed. The second auxiliary electrode AE2 is connected to the first auxiliary electrode AE1 via the third contact hole CH3. A third auxiliary electrode AE3 is disposed on the second auxiliary electrode AE2. The third auxiliary electrode AE3 is electrically connected to the first auxiliary electrode AE1 via contact with the second auxiliary electrode AE2. The second auxiliary electrode AE2 and the third auxiliary electrode AE3 may be made of a low-resistivity metal. For example, the second auxiliary electrode AE2 and the third auxiliary electrode AE3 may be made of the same material as the aforementioned source electrode SE.

A first passivation film PAS1 is disposed on the substrate SUB1 including the thin film transistor TFT and the third auxiliary electrode AE3, and an overcoat layer OC is disposed on the first passivation film PAS1. In the emitting region EP, a via hole VIA exposing the drain electrode DE is located in some region of the overcoat layer OC. In the non-emitting region NP, a first passivation hole PAH1 exposing the third auxiliary electrode AE3 is formed in the first passivation film PAS1, and an over-hole OCH exposing the first passivation hole PAH1 and the third auxiliary electrode AE3 is formed in the overcoat layer OC.

A first barrier layer PTL1 is disposed on the overcoat layer OC to prevent moisture penetration. Specifically, the first barrier layer PTL1 is formed along the surfaces of the first passivation film PAS1 and overcoat layer OC, and makes contact with the third auxiliary electrode AE3. The first barrier layer PTL1 is disposed to cover the first passivation hole PAH1 of the first passivation film PAS1 and the over-hole OCH of the overcoat layer OC, in order to prevent moisture penetration into the interface of the first passivation film PAS1 and overcoat layer OC. As shown in the drawing, the first barrier layer PTL1 may fully cover the first passivation hole PAH1 of the first passivation film PAS1 and the over-hole OCH of the overcoat layer OC.

Thus, the first barrier layer PTL1 blocks the moisture penetration path by covering the interface of the first passivation film PAS1 and overcoat layer OC which is exposed to the inner periphery of the first passivation hole PAH1 of the first passivation film PAS1 and the inner periphery of the over-hole OCH of the overcoat layer OC and acts as the moisture penetration path. However, the structure of the first barrier layer PTL1 of the present invention is not specifically limited as long as it covers the interface of the first passivation film PAS1 and the overcoat layer OC.

The first barrier layer PTL1 may be made of a material that blocks moisture and is highly resistant to moisture, for example, a metal oxide. For example, the metal oxide may be a transparent metal oxide such as ITO, IZO, or ITZO, or an opaque metal oxide such as aluminum oxide ($AL_2O_3$), titanium oxide ($TiO_2$), or zirconium oxide ($ZrO_2$). While the present invention has been described with an example in which some materials are available, any well-known materials may be used as long as they are transparent or opaque metal oxides that block moisture and are highly resistant to moisture.

Further, the thickness of the first barrier layer PTL1 is not limited, and may have a thickness of 100 to 2,000 Å in order to prevent unnecessary thickening. The first barrier layer PTL1 can also be formed simultaneously with the process for the transparent metal oxide of the first electrode of the organic light-emitting diode to be described later. Thus, the first barrier layer PTL 1 can be the same thickness as the metal oxide of the first electrode. However, the first barrier layer PTL1 of the present invention is not limited to this and can be formed in a separate process from the first electrode.

Meanwhile, a second passivation film PAS2 is disposed on the substrate SUB1 including the first barrier layer PTL1. The second passivation film PAS2 serves to protect the underlying first barrier layer PTL1 and blocks the moisture penetration path along with the first barrier layer PTL1. The second passivation film PAS2 has a second passivation hole PAH2 exposing the first barrier layer PTL1. The second passivation film PAS2 blocks the moisture penetration path by covering the interface of the first passivation film PAS1 and overcoat layer OC, which is formed on the inner periphery of the first passivation hole PAH1 of the first passivation film PAS1 and the inner periphery of the over-hole OCH of the overcoat layer OC and may act as the moisture penetration path. Thus, the second passivation film PAS2 is disposed to overlap the third auxiliary electrode AE3, the first barrier layer PTL1, the first passivation hole PAH1, and the over-hole OCH. Like the aforementioned first passivation film PAS1, the second passivation film PAS2 may be a silicon oxide film (SiOx), a silicon nitride film (SiNx), or multiple layers of these compounds, and may be a material such as the material of the overcoat layer OC, a photoresist material, or a polyimide material.

Meanwhile, an organic light-emitting diode OLED is disposed on the overcoat layer OC in the emitting region EP. More specifically, the first electrode ANO is disposed on the overcoat layer OC where the via hole VIA is formed. The first electrode ANO acts as a pixel electrode, and is connected to the drain electrode DE of the thin-film transistor TFT via the via hole VIA. The aforementioned second passivation film PAS2 is also disposed on the first electrode ANO, and an open hole OPH is formed to expose the first electrode ANO.

In addition, a bank layer BNK defining a pixel is disposed on the first electrode ANO. In the emitting region EP, a pixel defining portion OP exposing the first electrode ANO is positioned on the bank layer BNK. In the non-emitting region NP, the bank layer BNK has a bank hole BNH exposing the underlying first barrier layer PTL1. The bank hole BNH forms an undercut structure at one side through an undercut process. That is, part of the inner periphery of the bank hole BNH forms an undercut structure that protrudes upward from the second passivation hole PAH2 of the second passivation film PAS2. The undercut structure of the bank hole BNH of the bank layer BNK is for bringing the second electrode CAT into contact with the first barrier layer PTL1 connected to the third auxiliary electrode AE3.

An organic layer EML contacting the first electrode ANO is located on the entire surface of the substrate SUB1, and the second electrode CAT is disposed on the organic layer EML. In the non-emitting region NP, the organic layer EML is disposed on the bank layer BNK, and part of organic layer EML is disconnected due to the undercut structure of the bank hole BNH of the bank layer BNK. By depositing the second electrode CAT on the organic layer EML, the second electrode CAT may come into contact with the first barrier layer PTL1 through the region where the organic layer EML is disconnected.

A third passivation film PAS3 is disposed on the second electrode CAT to protect the organic light-emitting diode OLED and layers that lie under it. A protection substrate SUB2 where color filters CF and a black matrix BM are formed is bonded to the substrate SUB1 through a filler FIL, thereby forming the display device according to the embodiment of the present invention.

Hereinafter, the above method for manufacturing a display device according to the exemplary embodiment of the present invention will be described with reference to FIGS. 8 to 12. Below is a description of a process for the characteristic parts of the present invention in which the third auxiliary electrode and the second electrode are electrically connected.

Figure 8:
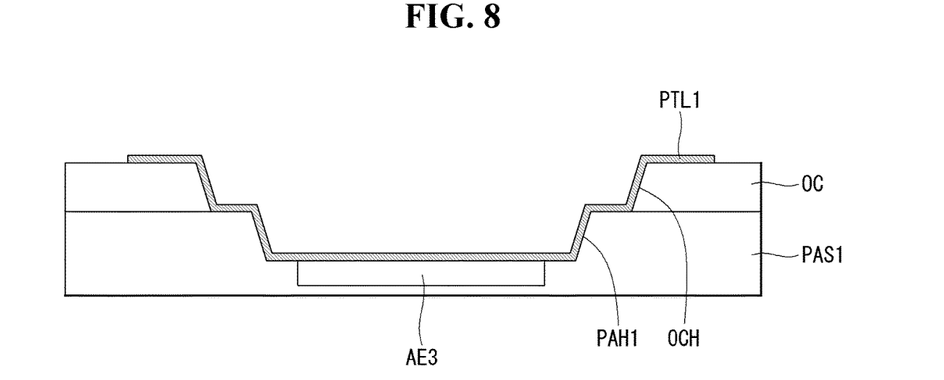
FIGS. 8 to 12 are views showing each process of a method for manufacturing a display device according to an embodiment of the present invention.

Referring to FIG. 8, the first passivation film PAS1 is deposited on the substrate SUB1 where the third auxiliary electrode AE3 is formed, and the overcoat layer OC is applied onto the first passivation film PAS1. Next, the over-hole OCH is formed in the overcoat layer OC by using a mask. Also, the first passivation hole PAH1 is formed by etching the first passivation film PAS1 exposed through the over-hole OCH by using another mask. As shown, the first passivation hole PAH1 exposes the underlying third auxiliary electrode AE3.

Next, the first barrier layer PTL1 is formed by depositing a metal oxide and patterning it using a mask. For example, the first barrier layer PTL1 is formed along the surfaces of the first passivation film PAS1 and overcoat layer OC to cover the first passivation hole PAH1 of the first passivation film PAS1 and the over-hole OCH of the overcoat layer OC. Thus, the first barrier layer PTL1 can prevent moisture penetration into the interface of the first passivation film PAS1 and overcoat layer OC.

Figure 9:
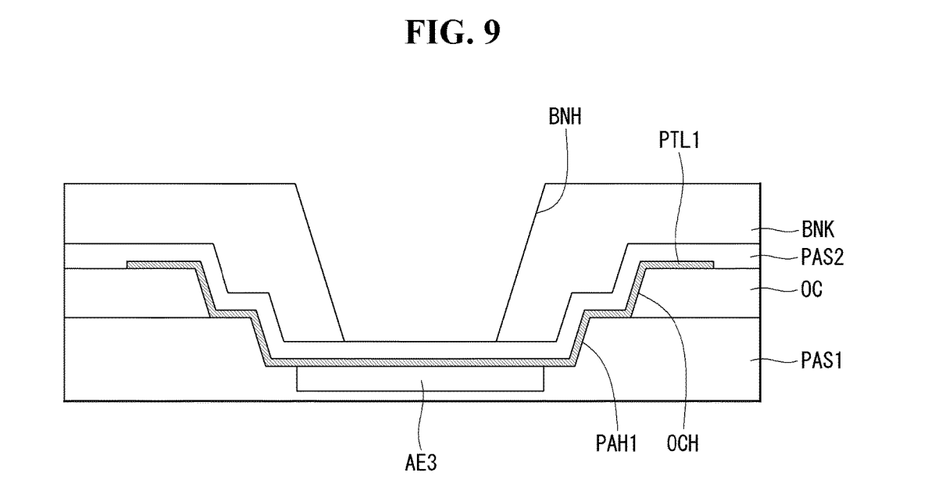

Next, referring to FIG. 9, the second passivation film PAS2 is deposited on the entire surface of the substrate SUB1 where the first barrier layer PTL1 is formed, and then the bank layer BNK is applied. Also, the bank hole BNH exposing the underlying second passivation film PAS2 is formed by etching the bank layer BNK using a mask.

Figure 10:
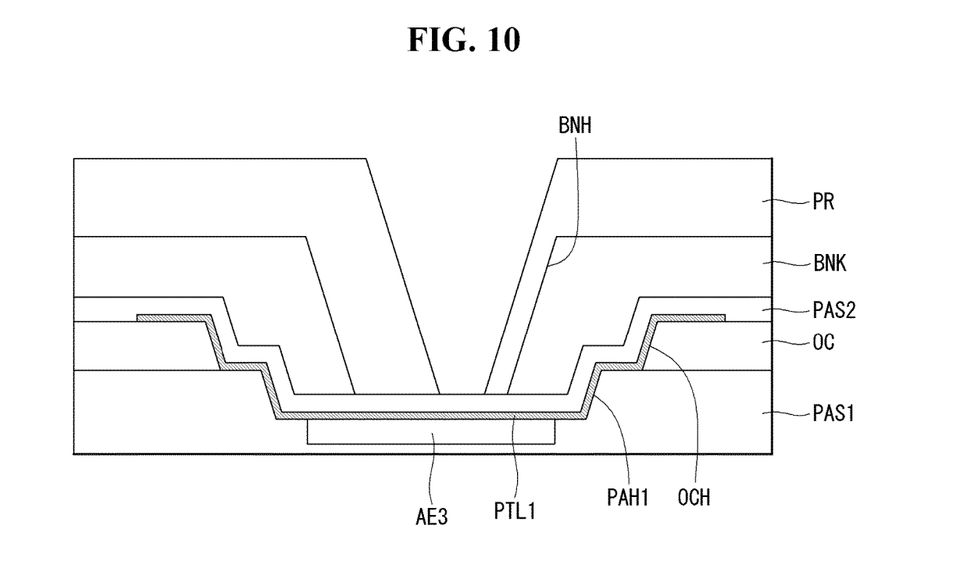

Next, referring to FIG. 10, a photoresist is applied onto the entire surface of the substrate SuB1 where the bank hole BNH is formed, and a photoresist pattern PR exposing part of the second passivation film PAS2 exposed through the bank hole BNH is formed. Also, the second passivation film PAS2 is etched by using the photoresist pattern PR as a mask.

Figure 11:
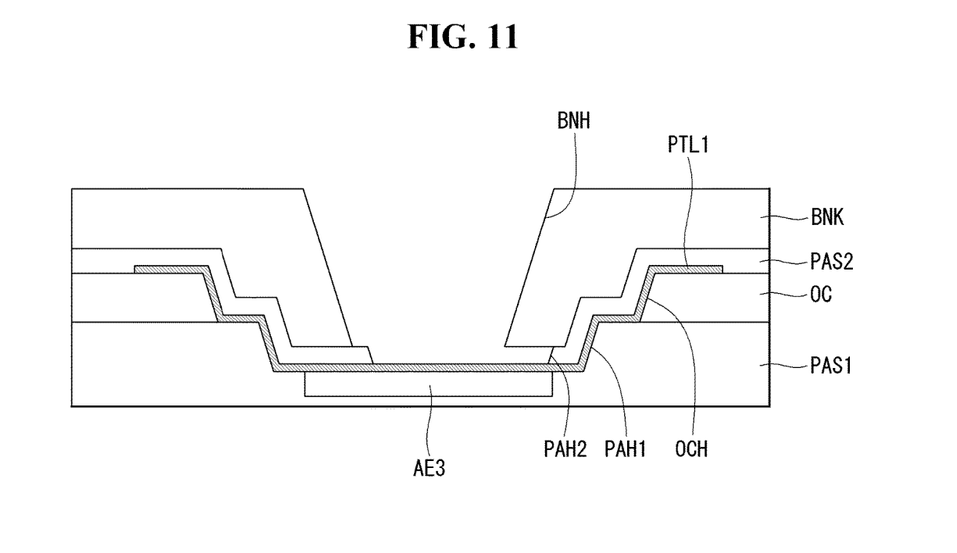

Referring to FIG. 11, the second passivation hole PAH2 exposing the underlying first barrier layer PTL1 is formed in the second passivation film PAS2 by the above-mentioned etching process. In particular, part of the second passivation hole PAH2 is over-etched down the bank layer BNK, whereby the bank hole BNH of the bank layer BNK forms an undercut structure.

Figure 12:
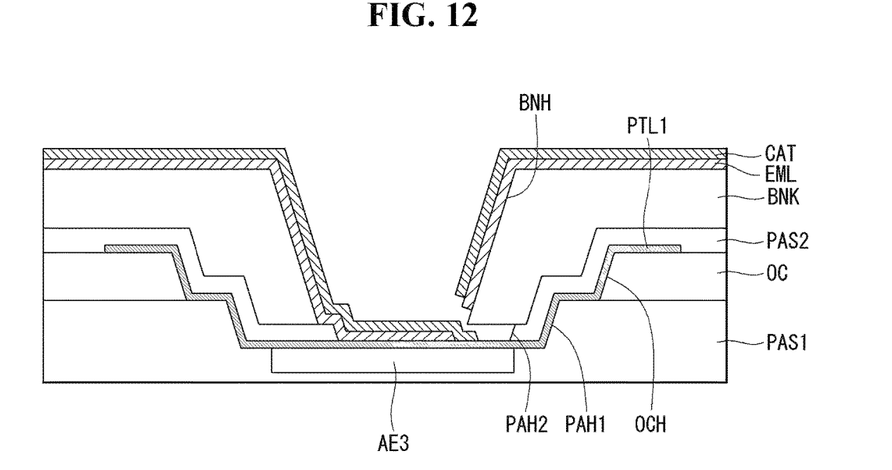

Next, referring to FIG. 12, when the organic layer EML is deposited onto the bank layer BNK, the organic layer EML is deposited and disconnected at the undercut structure of the bank hole BNH. Next, the second electrode CAT is deposited onto the organic layer EML. For example, the second electrode CAT is deposited all the way into the space between the disconnected parts of the organic layer EML, thereby coming into contact with the underlying first barrier layer PTL1. As such, it is possible to manufacture an organic light-emitting display in which the first barrier layer PTL1 and the second electrode CAT make contact with each other.

As described above, the display device according to the embodiment of the present invention blocks the undercut structure of the bank layer acting as a moisture penetration path and the interface of the first passivation film and overcoat layer, by including a first barrier layer and a second passivation film that can prevent moisture penetration between the auxiliary electrode and the second electrode. Accordingly, deterioration of the organic layer caused by moisture penetration can be prevented, thereby improving the display quality of the display device. Also, the display device according to the embodiment of the present invention may further include an additional barrier layer.

Figure 13:
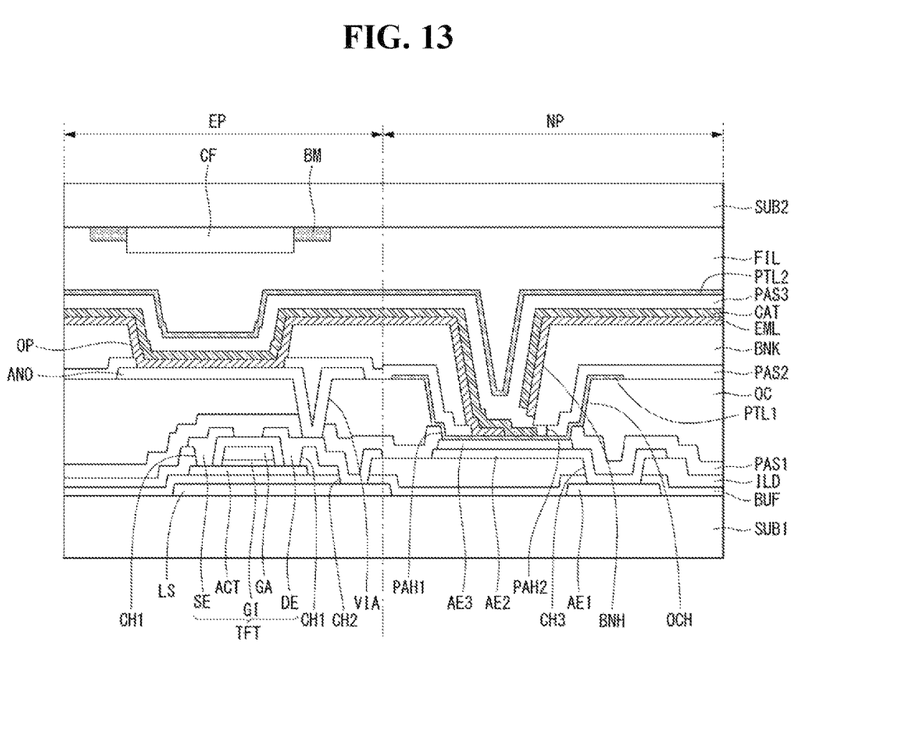
FIG. 13 is a cross-sectional view showing a display device according to another exemplary embodiment of the present invention.

FIG. 13 is a cross-sectional view showing a display device according to another exemplary embodiment of the present invention. In what follows, descriptions of the same components as the foregoing exemplary embodiment will be omitted. Referring to FIG. 13, a third passivation film PAS3 is disposed on the second electrode CAT, and a second barrier layer PTL2 is formed on the third passivation film PAS3. The second barrier layer PTL2 is for blocking moisture penetration into the third passivation film PAS3, and fully covers the third passivation film PAS3 to protect the internal elements.

The second barrier layer PTL2 may be made of the same material as the first barrier layer PTL1. Specifically, the second barrier layer PTL2 may be made of a material that blocks moisture and is highly resistant to moisture—for example, a transparent metal oxide such as ITO, IZO, or ITZO, or an opaque metal oxide such as such as aluminum oxide ($AL_2O_3$), titanium oxide ($TiO_2$), or zirconium oxide ($ZrO_2$).

While the present invention has been described with an example in which some materials are available, any well-known materials may be used as long as they are transparent or opaque metal oxides that block moisture and are highly resistant to moisture. The thickness of the second barrier layer PTL2 is also not limited, and the second barrier layer PTL2 may have a thickness of 100 to 2,000 Å in order to prevent unnecessary thickening.

In the present invention, the first barrier layer can block moisture from penetrating between the auxiliary electrode and the second electrode at a connecting portion between the second electrode and the auxiliary electrode, and the second barrier layer can be further provided to block any part of the third passivation film along which moisture may penetrate.

As above, the display device according to the embodiment of the present invention can block the undercut structure of the bank layer acting as a moisture penetration path and the interface of the first passivation film and overcoat layer, by including a first barrier layer and a second passivation film that can prevent moisture penetration between the auxiliary electrode and the second electrode. Accordingly, deterioration of the organic layer caused by moisture penetration can be prevented, thereby improving the display quality of the display device. Moreover, the display device according to the embodiment of the present invention may further include a second barrier layer to block any part of the third passivation film along which moisture may penetrate.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A display device comprising:
a substrate including an emitting region and a non-emitting region;
an auxiliary electrode disposed in the non-emitting region;
a first passivation film covering the emitting region and the auxiliary electrode in the non-emitting region and including a first passivation hole exposing the auxiliary electrode;

an overcoat layer disposed on the first passivation film and including an over-hole exposing the auxiliary electrode;

a first barrier layer disposed on the first passivation film and the overcoat layer and contacting the auxiliary electrode;

a second passivation film disposed on the first barrier layer and including a second passivation hole exposing the first barrier layer;

a bank layer disposed on the second passivation film and including a bank hole exposing the first barrier layer and having an undercut structure;

an organic layer disposed on the bank layer and being disconnected by the undercut structure; and a second electrode disposed on the organic layer and contacting the first barrier layer via the bank hole of the bank layer.

2. The display device of claim 1, wherein the first barrier layer covers the first passivation hole and the over-hole.

3. The display device of claim 2, wherein the first barrier layer covers an interface of the first passivation film and the overcoat layer formed on inner peripheries of the first passivation hole and the over-hole.

4. The display device of claim 1, wherein part of an inner periphery of the bank hole protrudes towards an inner periphery of the second passivation hole.

5. The display device of claim 4, wherein the second electrode is disconnected by the undercut structure of the bank hole.

6. The display device of claim 1, wherein the first barrier layer is made of a metal oxide.

7. The display device of claim 1, wherein the second passivation hole overlaps the auxiliary electrode and the first barrier layer.

8. The display device of claim 1, wherein the emitting region includes an organic light-emitting diode having a first electrode, the organic layer, and the second electrode.

9. The display device of claim 1, further comprising:
a third passivation film disposed on the second electrode; and
a second barrier layer disposed on the third passivation film.

10. The display device of claim 9, wherein the first barrier layer and the second barrier layer are made of the same material.

11. The display device of claim 1, wherein the first barrier layer blocks a path through which moisture penetrates inside in a boundary region between the first passivation film and the overcoat layer, and in a region where the organic layer and the second electrode is smaller in thickness.

12. The display device of claim 1, wherein the first barrier layer prevents deterioration of the organic layer or abnormal operation of a thin-film transistor included in the display device and a defect at a contact portion between the second electrode and the auxiliary electrode.

13. The display device of claim 1, wherein the first barrier layer is formed along surfaces of the first passivation film and the overcoat layer, and makes contact with the auxiliary electrode.

14. The display device of claim 1, wherein the first barrier layer is disposed to cover the first passivation hole of the first passivation film and the over-hole of the overcoat layer, in order to prevent moisture penetration into an interface of the first passivation film and the overcoat layer.

15. The display device of claim 1, wherein the first barrier layer fully covers the first passivation hole of the first passivation film and the over-hole of the overcoat layer, in order to block a moisture penetration path by covering an interface of the first passivation film and the overcoat layer, which is exposed to an inner periphery of the first passivation hole of the first passivation film and an inner periphery of the over-hole of the overcoat layer.

16. The display device of claim 1, wherein the first barrier layer has a thickness of 100 to 2,000 Å.

17. The display device of claim 1, wherein the first barrier layer has a same thickness of a metal oxide of the first electrode.

18. The display device of claim 1, wherein the second passivation film is disposed on the substrate including the first barrier layer to protect the first barrier and block a moisture penetration path along with the first barrier layer.

19. The display device of claim 18, wherein the second passivation film including the second passivation hole exposing the first barrier layer blocks the moisture penetration path by covering an interface of the first passivation film and the overcoat layer, which is formed on an inner periphery of the first passivation hole of the first passivation film and an inner periphery of the over-hole of the overcoat layer.

20. The display device of claim 19, wherein the second passivation film is disposed to overlap the auxiliary electrode, the first barrier layer, the first passivation hole, and the over-hole.

* * * * *